United States Patent [19]

Matsubara et al.

[11] Patent Number: 5,354,921
[45] Date of Patent: Oct. 11, 1994

[54] SINGLE CRYSTALLINE FIBROUS SUPERCONDUCTIVE COMPOSITION AND PROCESS FOR PREPARING THE SAME

[75] Inventors: Ichiro Matsubara, Ikeda; Hideo Tanigawa, Kawanishi; Toru Ogura, Toyonaka; Hiroshi Yamashita, Kawanishi; Makoto Kinoshita, Ikeda, all of Japan

[73] Assignee: Agency of Industrial Science & Technology, Tokyo, Japan

[21] Appl. No.: 112,054

[22] Filed: Aug. 26, 1993

Related U.S. Application Data

[63] Continuation of Ser. No. 797,156, Nov. 26, 1991, abandoned, which is a continuation of Ser. No. 470,467, Jan. 26, 1990, abandoned.

[30] Foreign Application Priority Data

Mar. 23, 1989 [JP] Japan .................... 1-73641

[51] Int. Cl.$^5$ ............... H01L 39/12; H01B 12/00; H01B 12/02
[52] U.S. Cl. .................. 505/121; 505/729; 505/740; 505/782; 252/518; 252/521
[58] Field of Search .............. 252/518, 521; 505/1, 505/782, 729, 740

[56] References Cited

U.S. PATENT DOCUMENTS

| | | | |
|---|---|---|---|
| 4,880,771 | 11/1989 | Cava et al. | 252/518 |
| 4,970,194 | 11/1990 | Schwartzkopf | 505/740 |
| 5,001,109 | 3/1991 | Spencer | 505/1 |
| 5,053,384 | 10/1991 | Schwartzkopf | 505/1 |

FOREIGN PATENT DOCUMENTS

| | | | |
|---|---|---|---|
| 0212225 | 8/1989 | Japan | 505/782 |
| 1212225 | 8/1989 | Japan | 505/1 |

OTHER PUBLICATIONS

Van Dover "Crit. Current, Density in Single Crystal Bi$_{2.2}$Sr$_2$Ca$_{0.8}$Cu$_2$O$_x$" Appl. Phys. Lett v. 52 (22) May 30, 1988 pp. 1910–1912.
Kanai "Dopant Effects on the Superconductivity . . . " Jap. Jnl. Appl. Phys. v. 28(4) April 1989 pp. L551–L554.
Honda "Preparation of . . . Bi Sr Ca K Cu O Oxide System" Jap. Jnl, Appl. Phys Lett v. 27(4) Apr. 1988, pp. L545–L547.
Ramesh "Doping Mechanism in Bi(Pb)-Sr-Ca-Cu-O Superconductors" J. Appl. Phys. v. 66 (10) No. 15, 1989.
Shah "Growth and Microstructure of Bi-Sr-Ca-Cu-O . . . " Appl. Phys. Lett. v. 53(5) Aug. 1, 1908 pp. 429–431.
Subramia "A New High-Temp. Superconductor: Bi$_2$Sr$_{3x}$Cn$_x$Cn$_0$O" Science v. 239 Feb. 26, 1988 pp. 1015–1017.
Hinks "Preparation of Bi-Sr-Co-Cu-O Superconductors . . . " Appl. Phys. Lett. v. 53 (5) Aug. 1, 1988 pp. 423–425.
Schrodt "Properties of Bi Sr Ca Cu O High Tc . . . " Solid State Comm v. 67(9) 1988 pp. 871–874.
Luo "High Tc Superconductive Prepered by Oxidation" Mat Sc. and Eng. B3 Aug. 1989 pp. 325–330.
Mizuno "Superconductivity of Bi$_2$Sr$_2$Ca$_2$Cu$_3$Pb Q . . . " Jap Jnl. Appl. Phy. v 22(7) Jul. 1988 pp. 1225–1227.

Primary Examiner—Paul Lieberman
Assistant Examiner—M. Kopec
Attorney, Agent, or Firm—Armstrong, Westerman, Hattori, McLeland & Naughton

[57] ABSTRACT

There is disclosed a single crystalline fibrous superconductive composition represented by the atomic compositional formula: Bi$_2$Sr$_2$CaCu$_2$M$_X$O$_Y$ wherein $0<X<0.5$; $7.8<Y<8.5$; and M is at least one member selected from the group consisting of Pb, Sn, Sb, In, Cd, Ga, Ge, K, Li, and Na. This composition is prepared by a process comprising the step of mixing source material with one another to prepare a mixture having an atomic compositional ratio: Bi=1.00, Sr=0.5~2.0, Ca=0.5~5.0, Cu=1.0~7.0, and M=0.1~1.0, wherein M is at least one member selected from the group consisting of Pb, Sn, Sb, In, Cd, Ga, Ge, K, Li, and Na, the step of melting the mixture to prepare a molten material having an atomic compositional ratio: Bi=1.00, Sr=0.5~2.0, Ca=0.5~5.0, Cu=1.0~7.0, M=0.1~1.0, and O=3.5~8.8, the step of quenching the molten material to prepare a solid material, and the step of heat-treating the solid material in a stream of a gas containing oxygen.

1 Claim, 1 Drawing Sheet

SINGLE CRYSTALLINE FIBROUS SUPERCONDUCTIVE COMPOSITION AND PROCESS FOR PREPARING THE SAME

This application is a continuation of application Ser. No. 07/797,156 filed Nov. 26, 1991, now abandoned, which is a continuation of Ser. No. 07/470,467 filed Jan. 26, 1990, now abandoned.

BACKGROUND OF THE INVENTION

The present invention relates to a single crystalline fibrous superconductive composition and a process for preparing the same.

Since the discovery of high temperature superconductors based on a metal oxide (hereinafter referred to briefly as the "oxide"), practical application of such superconductors is under active research and development in a wide variety of fields.

More specifically, for example, the techniques of fabrication of thin films of oxide superconductive materials are necessary for producing devices for computers and the like wherein SQUID (superconducting quantum interference devices) or Josephson devices are used. As to the fabrication of thin films, it is reported that a grain boundary-free single crystalline thin film having sufficiently practical characteristics including a critical current density of higher than about $10^6$ A/cm$^2$ can be formed by the sputtering method, the vacuum evaporation method, the CVD method or the like.

Meanwhile, in the fields of application of an oxide superconductor to the storage and transmission of electric energy, creation of a strong magnetic field, etc. wherein the characteristics of the oxide superconductor is utilized, the fabrication of wires from such an oxide superconductor is necessary. Attempts to fabricate wires from an oxide superconductor include the method wherein a calcined oxide superconducting powder packed in a silver sheath is heat-treated again, the sol-gel method, the method wherein a suspension of an oxide superconducting powder in a solution of a polymer is used to draw wires therefrom, and the method wherein a molten oxide superconductor is drawn into wires.

However, wires fabricated by any of these methods are in the form of a low-density polycrystalline substance with grain boundaries without exception. Thus, no wires having a practical level of characteristics have been produced yet. Furthermore, such wires have defects of brittleness, poor processability, low bending strength, etc., which are inherent in polycrystalline substances.

SUMMARY OF THE INVENTION

A first object of the present invention is to provide a single crystalline fibrous superconductive composition free of the above-mentioned defects of the conventional superconductive wires, and a process for producing the same.

A second object of the present invention is to provide a bendable superconductive composition, and a process for producing the same.

The above-mentioned objects can be attained by providing a single crystalline fibrous superconductive composition represented by the atomic compositional formula: $Bi_2Sr_2CaCu_2M_xO_y$ wherein $0<x<0.5$; $7.8<y<8.5$; and M is at least one member selected from the group consisting of Pb, Sn, Sb, In, Cd, Ga, Ge, K, Li, and Na.

The superconductive composition of the present invention can be prepared by a process comprising the step of mixing source materials with one another to prepare a mixture having an atomic compositional ratio: Bi=1.00, Sr=0.5~2.0, Ca=0.5~5.0, Cu=1.0~7.0, and M=0.1~1.0, the step of melting the mixture to prepare a molten material having an atomic compositional ratio: Bi=1.00, Sr=0.5~2.0, Ca=0.5~5.0, Cu=1.0~7.0, M=0.1~1.0, and O=3.5~8.8, the step of quenching the molten material to prepare a solid material, and the step of heat-treating the solid material in a stream of a gas containing oxygen. In the above-mentioned two atomic compositional ratios, M is at least one member selected from the group consisting of Pb, Sn, Sb, In, Cd, Ga, Ge, K, Li, and Na.

THE PREFERRED EMBODIMENTS

Figure 1:
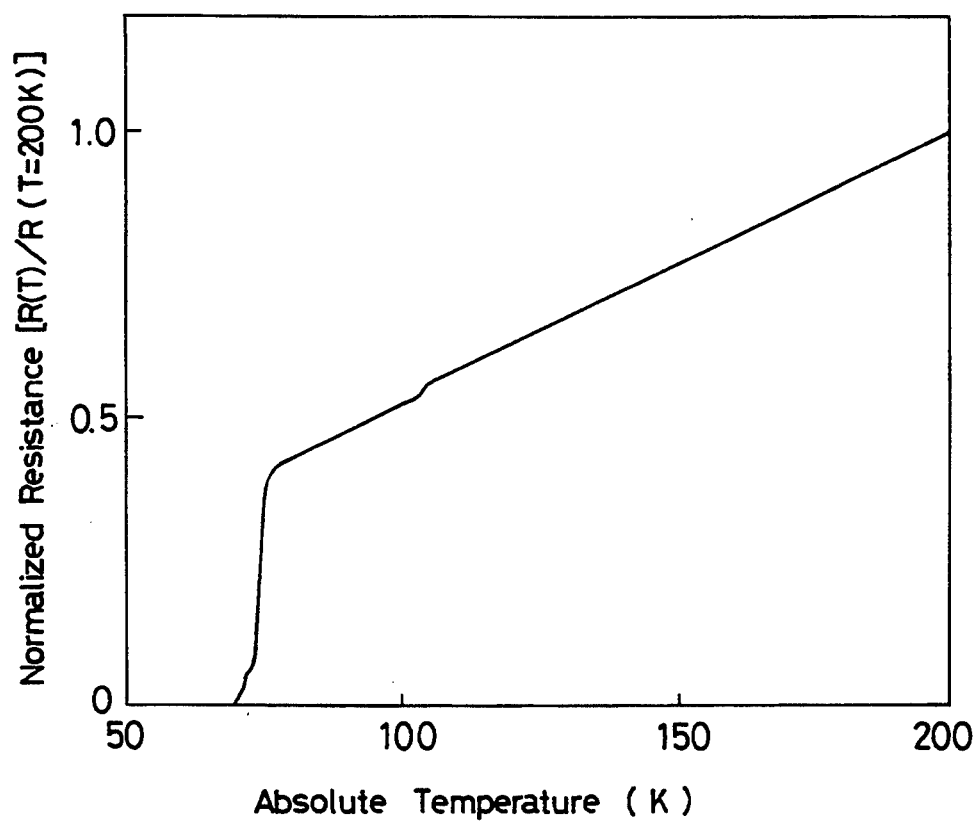
FIG. 1 is a diagram showing the absolute temperature versus electric resistance curve of the single crystalline fibrous superconductive composition of the present invention.

As the source materials to be used in the preparation of the superconductive composition of the present invention, use may be made of substances respectively containing Bi, Sr, Ca and Cu as the main components of the composition, and a substance containing at least one member selected from the group consisting of Pb, Sn, Sb, In, Cd, Ga, Ge, K, Li and Na as the adjuvant component of the composition.

Specifically, any source material can be used as the main components without any particular restriction in so far as they can form oxides through melting thereof. Such usable source materials include simple metallic substances, metal oxides, metal carbonates, metal nitrates, and metal sulfates. Alternatively, use can be made of compounds containing at least two metallic elements, such as $CaCuO_2$ and $Bi_2CuO_4$, as well as mixtures of at least two compounds containing the same metallic element, for example, a mixture of oxide and carbonate of the same metallic element. The foregoing description about the source materials for the main components holds good for also the source materials for the adjuvant component.

In the course of the preparation of the superconductive composition of the present invention, the foregoing source materials for the main components and the adjuvant component are mixed together and molten. An important factor herein is the mixing ratio of the source materials for the main components and the adjuvant component. These source materials are mixed together at an atomic compositional ratio: Bi=1.00, Sr=0.5~2.0, Ca=0.5~5.0, Cu=1.0~7.0, and M (adjuvant component)=0.1~1.0, followed by melting thereof. When the amount of any one of the above-mentioned source materials for either the main component or the adjuvant component is outside its range specified by the above-mentioned atomic compositional ratio, the formation of fibrous single crystals does not occur or encounters difficulty, if any.

The mixture of the source materials is molten in the presence of oxygen. No particular oxygen source is needed when the melting is effected in the air or when the source materials themselves contain a sufficient amount of oxygen.

The melting temperature and time are usually in the range of about 1,100 to about 1,200° C. and in the range of about 15 to about 60 minutes, respectively, though they depends on the kinds of source materials, the compositional ratio, etc. For example, the melting is effected at about 1,150° C. for about 30 minutes. Melting means is not particularly restricted. Any arbitrary melting means such as an electric heating furnace or a gas heating furnace may be employed.

The foregoing melting of the above-mentioned mixture forms a molten material having the following atomic compositional ratio: $Bi=1.00$, $Sr=0.5\sim 2.0$, $Ca=0.5\sim 5.0$, $Cu=1.0\sim 7.0$, $M=0.1$ to $1.0$, and $O=2.5$ to $18.0$, wherein M is the adjuvant component. Namely, the atomic compositional ratio of the molten material is nearly for the sum of the atomic compositional ratio of the mixture of the source materials for the main components and the adjuvant component and the associated atomic compositional ratio of oxygen attributed to oxides formed through the melting.

According to the process of the present invention, the molten material is subsequently quenched to form a glassy solid material. The term "quenching" used herein means cooling at a rate of at least $10^{3°}$ C./sec. When the cooling rate is lower than $10^{3°}$ C./sec as in the case of slow cooling of the molten material, when a calcined powder of the source materials prepared by a solid-phase reaction is molded using a mold or the like, or when such a calcined powder is sintered, no fibrous single crystals can be obtained through a heat treatment as will be described later, even when the amounts of the main components and the adjuvant component are all within the respective range specified hereinbefore. The cooling rate during the course of quenching is usually about $10^{3°}$ C./min though the upper limit thereof is not particularly restricted. Employable quenching methods include one wherein use is made of twin rollers or a single roller, the splat quenching method, the free fall cooling method, and the method wherein a molten material cast on a metallic plate is pressed from above.

Subsequently, the resulting glassy solid material, for example, the one in the form of a glassy solid plate with suitable dimensions (e.g., about 1 mm in thickness), is heat-treated in a stream of a gas containing oxygen at a temperature of 820 to 870° C. Usable gases containing oxygen include a mixed gas of oxygen with an inert gas such as nitrogen, and pure oxygen gas. The flow rate of the oxygen-containing gas is in the range of 50 to 1,000 ml/min. When the flow rate of the oxygen-containing gas is outside the above-mentioned range, no fibrous single crystals are formed or the formation of fibrous single crystals are notably hindered and hence retarded even if all the other conditions are satisfied.

The heat treatment time is usually about 100 to 300 hours though it is not particularly restricted. As a result of the heat treatment, a solid material, for example, fibrous superconductive single crystals grown vertically to the plane of the solid plate and having a compositional formula: $Bi_2Sr_2CaCu_2M_xO_y$, wherein $0<x<0.5$; $7.8<y<8.5$; and M is at least one member selected from the group consisting of Pb, Sn, Sb, In, Cd, Ga, Ge, K, Li, and Na, can be obtained.

The fibrous single crystals have a length of up to 15 mm, and a rectangular cross section with a thickness of 1 to 10 μm and a width of 10 to 500 μm. The above-mentioned form can be varied depending on the kinds of starting materials, the compositional ratio, the heat treatment conditions, etc. It sometimes happens that the length of the fibrous single crystals reaches about 15 to 20 mm.

Although the role of the adjuvant component such as Pb has not been fully elucidated yet, such a component is presumed to be greatly involved in the formation of fibrous superconductive crystals from a glassy solid material formed from a molten material through quenching thereof. Since the adjuvant component with the exception of Li and Pb hardly remains in the fibrous superconductive crystals obtained after the heat treatment, in a stream of an oxygen-containing gas, of the solid material formed from the molten material through quenching thereof, there are no influences of the adjuvant component on the superconduction characteristics of the superconductive crystals. In the case of Li as the adjuvant component, the remaining Li has favorable influences on the superconduction characteristics of the superconductive crystals, such as the zero resistance temperature is 81 K.

The superconductive composition of the present invention prepared by the foregoing process and having a compositional formula: $Bi_2Sr_2CaCu_2M_xO_y$ wherein $0<x<0.5$; $7.8<y<8.5$; and M is at least one member selected from the group consisting of Pb, Sn, Sb, In, Cd, Ga, Ge, K, Li, and Na is in the form of fibrous single crystals, which are characterized by their bendability. Accordingly, these single crystals can be fabricated into wires through spot welding using a laser beam or the like. Such wires is expected to be utilized in a wide variety of fields, including applications thereof to magnet materials for magnetic field generation, materials for fabrication of wires for use in the storage and transmission of electric energy, materials of Josephson devices of point contact type wherein the tip shape of the wire is utilized, etc.

A description will now be made of Examples of the process of the present invention.

EXAMPLE 1

Source materials were well mixed with one another at an atomic compositional ratio specified in the following Table 1. 15 g of the resulting mixture was placed in an alumina crucible and heated in an electric furnace at 1,150° C. for 30 minutes to effect melting thereof.

Subsequently, the resulting molten material was cast on a steel plate and covered with another steel plate from above to sandwich the molten material between the two steel plates to thereby quench the molten material. Thus, a glassy solid material in the form of a plate having a thickness of 1 mm was obtained.

Subsequently, the solid material plate was placed on an alumina boat and heat-treated in an oxygen stream in the electric furnace at 840° C. for 120 hours.

Thus, fibrous single crystals grown vertically to the plane of the solid material plate were obtained. It was confirmed through X-ray analysis that the crystals had a compositional formula: $Bi_2Sr_2CaCu_2Pb_xO_y$ wherein $0<x<0.5$, and $7.8<y<8.5$.

The electric resistance versus absolute temperature relationship of the fibrous single crystals as examined by the DC four-probe method was as shown in FIG. 1. The temperature at which the electric resistance of the fibrous single crystals reached a value of zero was 70 K.

The source materials used as respective elemental sources in this Example and the following Examples are as follows:

Bi source ... bismuth oxide ($Bi_2O_3$)
Sr source ... strontium carbonate ($SrCO_3$)

Ca source ... calcium carbonate (CaCO$_3$)
Cu source ... copper oxide (CuO)
Pb source ... lead oxide (PbO)

EXAMPLES 2 to 12

A mixture of source materials having a composition specified in Table 1 was molten, quenched into a solid material, and heat-treated to form fibrous single crystals according to the same procedure as that of Example 1 except that the proportions of elements other than Bi relative to Bi were varied.

It was confirmed that all kinds of fibrous single crystals formed in the above-mentioned manner exhibited superconduction characteristics camparable or superior to those of Example 1.

TABLE 1

|      | Bi  | Sr   | Ca   | Cu   | Adjuvant component | Length of crystals |
|------|-----|------|------|------|--------------------|--------------------|
| (1)  | 1.0 | 0.95 | 1.1  | 2.0  | Pb; 0.25           | 15 mm              |
| (2)  | 1.0 | 0.95 | 1.25 | 2.25 | Pb; 0.25           | 10                 |

TABLE 1-continued

|      | Bi  | Sr   | Ca   | Cu   | Adjuvant component | Length of crystals |
|------|-----|------|------|------|--------------------|--------------------|
| (3)  | 1.0 | 1.11 | 1.22 | 2.22 | Pb; 0.17           | 8                  |
| (4)  | 1.0 | 0.95 | 1.1  | 1.0  | Pb; 0.15           | 11                 |
| (5)  | 1.0 | 0.95 | 1.1  | 2.0  | Sn; 0.25           | 3                  |
| (6)  | 1.0 | 0.95 | 1.1  | 2.0  | Sb; 0.25           | 6                  |
| (7)  | 1.0 | 0.95 | 1.1  | 2.0  | In; 0.25           | 5                  |
| (8)  | 1.0 | 0.95 | 1.1  | 2.0  | Cd; 0.25           | 3                  |
| (9)  | 1.0 | 0.95 | 1.1  | 2.0  | Ca; 0.25           | 6                  |
| (10) | 1.0 | 0.95 | 1.1  | 2.0  | Ge; 0.25           | 4                  |
| (11) | 1.0 | 0.95 | 1.1  | 2.0  | K; 0.25            | 11                 |
| (12) | 1.0 | 0.95 | 1.1  | 2.0  | Na; 0.25           | 5                  |
| (13) | 1.0 | 0.95 | 1.1  | 2.0  | Li; 0.25           | 10                 |

What is claimed is:

1. A superconductive composition of the formula $Bi_2Sr_2CaCu_2M_xO_y$, wherein $0.15<x<0.5$; $7.8<y<8.5$; and M is at least one member selected from the group consisting of Pb, Sn, Sb, In, Cd, Ga, Ge, K, Li and Na; said superconductive composition comprising a bendable fibrous single crystal rectangular in cross-section having a thickness of 1 to 10 $\mu$m, and a width of 10 to 500 $\mu$m and a length of 15 to 20 mm, and capable of being fabricated into a wire.

* * * * *